(12) United States Patent
Banna et al.

(10) Patent No.: US 9,945,033 B2
(45) Date of Patent: Apr. 17, 2018

(54) HIGH EFFICIENCY INDUCTIVELY COUPLED PLASMA SOURCE WITH CUSTOMIZED RF SHIELD FOR PLASMA PROFILE CONTROL

(71) Applicant: APPLIED MATERIALS, INC., Santa Clara, CA (US)

(72) Inventors: Samer Banna, San Jose, CA (US); Vladimir Knyazik, Palo Alto, CA (US); Waheb Bishara, Menlo Park, CA (US); Valentin Todorow, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 616 days.

(21) Appl. No.: 14/572,149

(22) Filed: Dec. 16, 2014

(65) Prior Publication Data

US 2015/0191823 A1  Jul. 9, 2015

Related U.S. Application Data

(60) Provisional application No. 61/923,807, filed on Jan. 6, 2014.

(51) Int. Cl.
*H05B 6/02* (2006.01)
*C23C 16/46* (2006.01)
(Continued)

(52) U.S. Cl.
CPC ............ *C23C 16/505* (2013.01); *C23C 16/46* (2013.01); *H01J 37/321* (2013.01);
(Continued)

(58) Field of Classification Search
CPC ............................ H01J 37/3211; H01J 37/321
USPC ....... 219/685, 544–553, 438, 486, 538, 539, 219/541; 156/345.27, 345.29, 345.1, 156/345.37, 345.38, 345.48; 118/715, 118/724, 723 I, 723 IR, 723 R, 723 AN; 438/710, 758
See application file for complete search history.

(56) References Cited

U.S. PATENT DOCUMENTS 6,071,372 A    6/2000  Ye et al.
6,685,799 B2   2/2004  Davis et al.
(Continued)

OTHER PUBLICATIONS

International Search Report and Written Opinion dated Mar. 30, 2015 for PCT Application No. PCT/US2015/010115.

*Primary Examiner* — Quang Van
(74) *Attorney, Agent, or Firm* — Moser Taboada; Alan Taboada (57) ABSTRACT

Apparatus for processing substrates are provided herein. In some embodiments, plasma processing apparatus may include a process chamber having a dielectric lid and an interior processing volume beneath the dielectric lid, a first RF coil to couple RF energy into the processing volume, and an RF shielded lid heater coupled to a top surface of the dielectric lid. The RF shielded lid heater may include an annular member, and a plurality of spokes, wherein each of the plurality of spokes includes one of (a) a first portion that extends downward from the annular and couples the annular member to a second portion of the spoke that extends radially inward, or (b) a first portion that extends radially outward from the annular member.

21 Claims, 4 Drawing Sheets

(51) Int. Cl.
- *B29C 35/02* (2006.01)
- *C23C 16/505* (2006.01)
- *H01J 37/32* (2006.01)
- *H05B 6/62* (2006.01)

(52) U.S. Cl.
CPC ... *H01J 37/32119* (2013.01); *H01J 37/32522* (2013.01); *H01J 37/32651* (2013.01); *H05B 6/02* (2013.01); *H05B 6/62* (2013.01)

(56) References Cited

U.S. PATENT DOCUMENTS

| | | |
|---|---|---|
| 7,854,213 B2 | 12/2010 | Brcka |
| 2009/0236315 A1* | 9/2009 | Willwerth ......... H01J 37/32522 216/67 |
| 2012/0090784 A1 | 4/2012 | Ouye et al. |
| 2012/0273135 A1 | 11/2012 | Hida et al. |
| 2013/0126476 A1 | 5/2013 | Marakhtanov et al. |
| 2013/0189848 A1 | 7/2013 | Willwerth et al. |
| 2013/0220975 A1 | 8/2013 | Dhindsa |
| 2013/0306239 A1 | 11/2013 | Sharpless et al. |

* cited by examiner

HIGH EFFICIENCY INDUCTIVELY COUPLED PLASMA SOURCE WITH CUSTOMIZED RF SHIELD FOR PLASMA PROFILE CONTROL

CROSS-REFERENCE TO RELATED APPLICATIONS

This application claims benefit of U.S. provisional patent application Ser. No. 61/923,807, filed Jan. 6, 2014, which is herein incorporated by reference in its entirety.

FIELD

Embodiments of the present disclosure generally relate to plasma processing equipment.

BACKGROUND

Inductively coupled plasma (ICP) process reactors generally form plasmas by inducing current in a process gas disposed within the process chamber via one or more inductive coils disposed outside of the process chamber. The inductive coils may be disposed externally and separated electrically from the chamber by, for example, a dielectric lid. When radio frequency (RF) current is fed to the inductive coils via an RF feed structure from an RF power source, an inductively coupled plasma can be formed inside the chamber from an electric field generated by the inductive coils.

AC/DC driven heaters are widely used to control surface temperature of the ceramic window isolating the process chamber from the ICP source, mainly to control the overall deposition on the dielectric window facing the plasma in the process chamber. In order to eliminate RF coupling of the ICP source to the AC/DC powered heated elements, the heaters are embedded within a aluminum or any conductor shield to prevent any interference of the RF to the AC/DC heaters. The aluminum shield also acts as partial RF shield between the ICP power coupled to the vacuum chamber and controls the overall sputter rate at the window due to voltages developed at the shield assuming the shield is floating (i.e., the shield is not grounded). However, power coupling to some conventional shield reduces the overall power coupled to the vacuum chamber in situations when the shield consists of a closed loop that current might be induced in. In particular when dual mode ICP coils are used, the coupling in the out-of-phase case may be significant due to the intensity of the magnetic field, leading to higher power losses, and lower power coupling efficiency compared to the in-phase case. The out-of-phase coupling is mainly used to eliminate or reduce M-shape signatures leading to non-uniformities.

Accordingly, the inventors have devised a substrate processing apparatus to better control RF coupling and substrate processing uniformity at the substrate surface level.

SUMMARY

Apparatus for processing substrates are provided herein. In some embodiments, a plasma processing apparatus may include a process chamber having a dielectric lid and an interior processing volume beneath the dielectric lid, a first radio-frequency (RF) coil disposed above the dielectric lid to couple RF energy into the processing volume, and a RF shielded lid heater coupled to a top surface of the dielectric lid comprising an annular member, and a plurality of spokes, wherein each of the plurality of spokes includes one of (a) a first portion that extends downward from the annular and couples the annular member to a second portion of the spoke that extends radially inward, or (b) a first portion that extends radially outward from the annular member.

In some embodiments, a radio-frequency (RF) shielded lid heater may include an annular member, a plurality of spokes coupled to the annular member, wherein each of the plurality of spokes includes a first portion that extends downward from the annular and couples the annular member to a second portion of the spoke that extends radially inward, and wherein the annular member and the plurality of spokes are RF shields, and one or more heater elements disposed within or below one or more of the plurality of spokes.

In some embodiments, a radio-frequency (RF) shielded lid heater may include an annular member disposed proximate an inner portion of the shielded lid heater, a plurality of spokes coupled to the annular member, wherein each of the plurality of spokes includes a first portion that extends radially outward from the annular member, wherein the annular member and the plurality of spokes are RF shields, and one or more heater elements disposed within or below at least one of the annular member or one or more of the plurality of spokes.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are thus not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for processing substrates are disclosed herein. Embodiments of the inventive apparatus advantageously facilitate the reduction in defect and/or particle formation on substrates during processing by minimizing the effect of the heater shield. The design of the shield in embodiments of the present disclosure reduces the power losses through the shield while running a multi-mode ICP source by allowing higher power coupling efficiency and increasing the overall window of operation. More specifically, embodiments of the present disclosure may advantageously improve the over-all power coupling in the out-of-phase case, and may provide an alternative way to reduce the M-shape signature even in the in-phase case. In addition, embodiments of the present disclosure may be used for any ICP coil design that might consist of one or more coils disposed in a vertical or flat orientation with and without phase control between the coils' currents.

Figure 1:
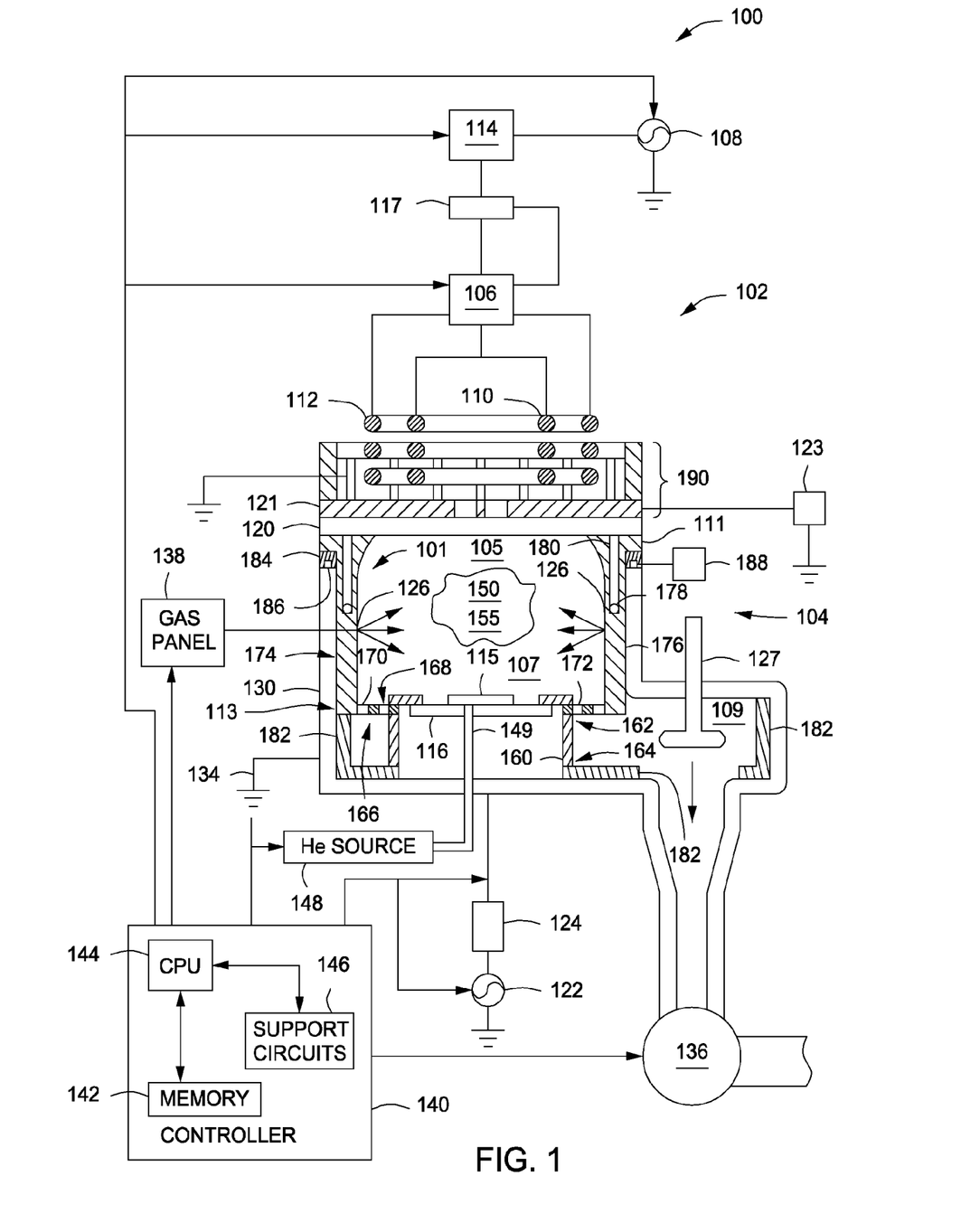
FIG. 1 depicts schematic view of a plasma reactor in accordance with some embodiments of the present disclosure.

FIG. 1 depicts a schematic side view of an inductively coupled plasma reactor (reactor 100) in accordance with embodiments of the present disclosure having a shielded lid heater 190. The reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present disclosure include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, may also be suitably modified in accordance with the present teachings. For example, suitable exemplary plasma reactors that may be utilized with the inventive methods disclosed herein may be found in U.S. patent application Ser. No. 12/821,609, filed Jun. 23, 2010 by V. Todorow, et al., and entitled, "INDUCTIVELY COUPLED PLASMA APPARATUS," or U.S. patent application Ser. No. 12/821,636, filed Jun. 23, 2010 by S. Banna, et al., and entitled, "DUAL MODE INDUCTIVELY COUPLED PLASMA REACTOR WITH ADJUSTABLE PHASE COIL ASSEMBLY." In addition, although FIG. 1 depicts an etch reactor, it is contemplated that the shielded lid heater 190 may beneficially be utilized in other types of plasma processing chambers, including chemical vapor deposition chambers, physical vapor deposition chambers, implantation chambers, nitriding chambers, plasma annealing chambers, plasma treatment chambers, and ashing chambers, among others. Thus, the embodiments of the ICP reactor in FIG. 1 is provided for illustrative purposes and should not be used to limit the scope of the disclosure.

The reactor 100 generally includes the process chamber 104 having a conductive body (wall) 130 and a lid 120 (e.g., a ceiling) that together define an inner volume 105, a substrate support 116 having a substrate 115 disposed thereon disposed within the inner volume 105, an inductively coupled plasma apparatus 102, and a controller 140. The wall 130 is typically coupled to an electrical ground 134 and in embodiments where the reactor 100 is configured as an inductively coupled plasma reactor, the lid 120 may comprise a dielectric material facing the inner volume 105 of the reactor 100. In some embodiments, the substrate support 116 may be configured as a cathode coupled through a matching network 124 to a biasing power source 122. The biasing source 122 may illustratively be a source of up to about 1000 W (but not limited to about 1000 W) at a frequency of approximately 13.56 MHz that is capable of producing either continuous or pulsed power, although other frequencies and powers may be provided for particular applications. In other embodiments, the source 122 may be a DC or pulsed DC source. In some embodiments, the source 122 may be capable of providing multiple frequencies or one or more second sources (not shown) may be coupled to the substrate support 116 through the same matching network 124 or one or more different matching networks (not shown) to provide multiple frequencies.

A shielded lid heater 190 may be disposed atop the lid 120 to facilitate heating the interior of the process chamber 104. The heater element 121 may be disposed between the lid 120 and the ICP coils (e.g., first and second coils 110, 112). In some embodiments, the shielded lid heater 190 and the one or more ICP coils may be disposed in a vertical or flat (horizontal) orientation. Although only two coils are shown, embodiments of the present disclosure may include one or more ICP coils with and without phase control between the coils' currents.

In some embodiments, the shielded lid heater 190 may include a resistive heating element and may be coupled to a power supply 123, such as an AC power supply, configured to provide sufficient energy to control the temperature of the shielded lid heater 190 to be between about 50 to about 100 degrees Celsius. In some embodiments, the shielded lid heater 190 may comprise a no break heater, such as an annular element, to facilitate uniform plasma formation within the process chamber 104. In some embodiments, the shielded lid heater 190 may be an open break heater.

The shielded lid heater 190 includes heater elements encapsulated in a metallic material, such as aluminum for example, to shield the heater elements from the RF power. The encapsulated heater elements form the shielded lid heater 190 that is adhered or clamped to the exterior surface of the lid 120, and disposed between the ICP coils and the dielectric lid 120. In some embodiments, the shielded lid heater 190 formed may be a Faraday shield. A Faraday shield is generally understood in the art to be a layer or plate of conductive material disposed between the RF antenna (i.e., the first and second coils 110, 112) and the lid of the chamber electrically connected (at least indirectly) to ground.

Figure 2:
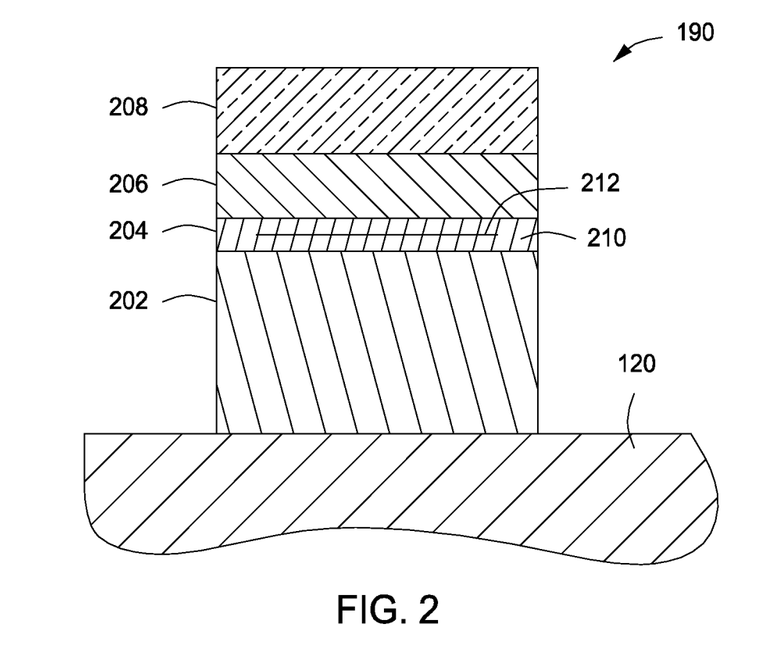
FIG. 2 depicts a schematic cross-sectional views of two embodiments of a shielded lid heater in accordance with some embodiments of the present disclosure.

FIG. 2 is a partial cross-sectional view of one embodiment of the shielded lid heater 190 disposed on the lid 120. In some embodiments, the shielded lid heater 190 generally includes a conductive base 202, a heater element 204 and an RF shield 206. The heater element 204 is sandwiched between the conductive base 202 and the RF shield 206. The heater element 204 generally includes a resistive element 212 embedded in an electrical insulator 210. The RF shield 206 substantially prevents the resistive element 212 from influencing the orientation of the magnetic and electrical field lines generated by the first and second coils 110, 112 passing through the lid 120 so that the plasma 155 may be more accurately positioned within the inner volume 105. The RF shield 206 is generally fabricated from a metallic material such as aluminum. In some embodiments, the heater base can be any conducting material that will shield the heater elements 204 from the RF. The heater elements 204 may be embedded inside the conductive base 202. The RF shield 206 may be an aluminum foil, aluminum plate, or an aluminum coating applied to annular member 300 and/or spokes 308. In some embodiments, the annular member 300 and spokes 308 may be a monolithic structure while in other embodiments the annular member 300 and spokes 308 may be formed separately and coupled to each other (e.g., welded, bonded, fastened via fasteners, and the like.) In one embodiment, the RF shield 206 has the same plan form as the conductive base 202. The conductive base 202, heater element 204 and RF shield 206 may be secured using fasteners, clamped together or held by a suitable adhesive. In one embodiment, the components of the shielded lid heater 190 are secured together utilizing a high temperature epoxy.

In other embodiments, the heater elements 204 are printed circuit heater elements disposed directly on lid 120 and encapsulated by RF shield 206. The internal configuration of the shielded lid heater 190 is provided for illustrative purposes and should not be used to limit the scope of the disclosure. Optionally, a thermal insulator 208 may be disposed on the RF shield 206. The thermal insulator 208 is generally fabricated from a material which has little influence on the RF magnetic and electrical fields, such as a high temperature elastomer, such as a silicone or other high temperature foam. The thermal insulator 208 provides protection from burns that may be received if the lid heater 190 is inadvertently touched while at a high temperature. Other internal configurations of the shielded lid heater 190 may be used with embodiments of the present disclosure.

Typically, the shielded lid heater 190 may be used to control the sputtering rate through capacitive power coupling of the ICP source RF to the chamber, and may also be used to control the inductive power coupling of the ICP source RF to the chamber depending on the shape and material of the shielded lid heater 190. However, the inventors have observed that although the shielded lid heater 190 advantageously shields the heater elements 204 from the RF power, the shielded lid heater 190 also acts as a shield to the RF between the ICP coils and the chamber which may affect power coupling of the ICP source RF to the chamber. In addition, in a continuous no break shielded lid heater 190, the magnetic field produced by the first and second coils 110, 112 to provide RF power to the chamber may induce a current in the shielded lid heater 190 which leads to RF power losses and may adversely affects the power coupling of the ICP source RF to the chamber. Thus, embodiments of the present disclosure advantageously provide a shielded lid heater 190 that may substantially reduces the current induced in the shielded lid heater 190, and thus reduces the RF power losses that adversely affect the power coupling of the ICP source RF to the chamber. In addition, the apparatus and methods of the present disclosure may benefit a reactor configured for standard mode, where RF current flowing along the first inner coil 110 is in-phase with RF current flowing along the second outer coil 112, or dual mode, where the RF current flowing along the first inner coil 110 can be selectively in-phase or out-of-phase with RF current flowing along the second outer coil 112.

Figure 3A:
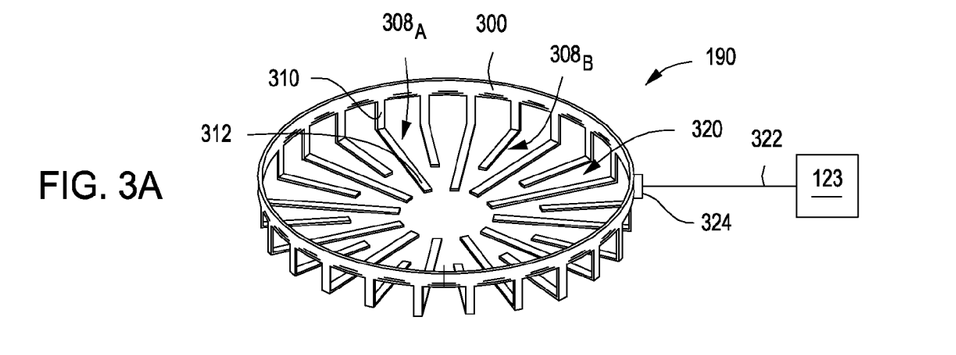
FIGS. 3A-3C are an isometric view, cross-sectional side view, and top view, respectively, of at least one embodiment of the shielded lid heater of FIG. 2.
Figure 3B:
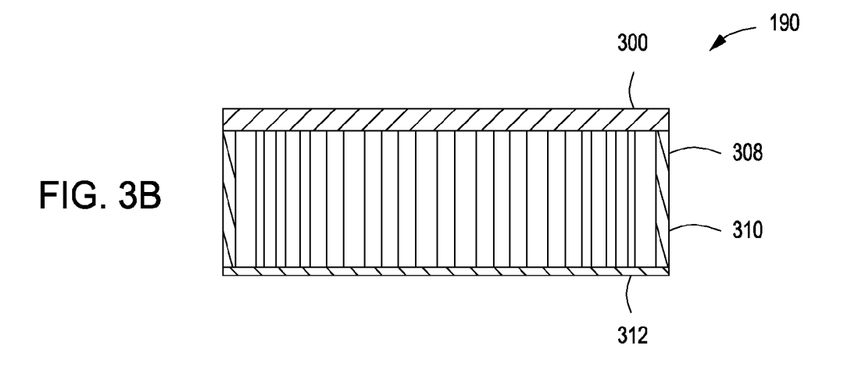
Figure 3C:
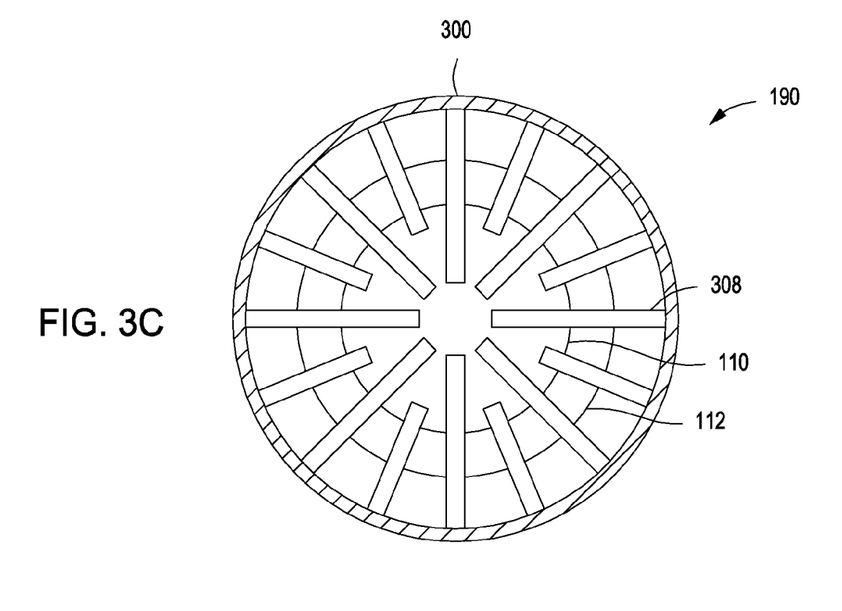

FIG. 3A-3C depict an isometric view, cross-sectional side view, and top view, respectively, of an inventive shielded lid heater 190 in accordance with some embodiments of the present disclosure. The shielded lid heater 190 generally includes an annular member 300 that is elevated above the surface of the lid 120 which is shielded lid heater is coupled to and a plurality of spokes 308. The annular member 300 is disposed about the first and second coils 110, 112 such that the first and second coils 110, 112 sit inside the central opening 320 formed by annular member 300. Specifically, the inventors have observed that by configuring the shielded lid heater 190 to position the annular member 300 in an area where the magnetic field produced by the coils 110, 112 is not as strong, the current induced in the shielded lid heater 190 by the magnetic field is minimized in the RF losses are reduced. This configuration of the shielded lid heater 190 is particularly suited for an out-of-phase case where the current through each coil 110,112 is run in opposite directions, however, may also be used when the current in the coils are in-phase.

In some embodiments, the annular member 300 may be disposed between about 3 inches and about 5 inches above the surface of the lid 120 which the shielded lid heater 190 is coupled to. In some embodiments, the annular member may be positioned to an area that is between about the lowest portion of the coils 110, 112 to about the top portion of coils 110, 112. In some embodiments, the diameter of the annular member may be about 2 inches to about 20 inches, although other diameters may be used. Each spoke 308 includes a vertical portion 310 that is coupled to, or otherwise extends from, a bottom surface of the annular member 300, or may be coupled or fastened to an inner or outer surface of the annular member 300. Each spoke 308 includes a horizontal portion 312 that is coupled to and extends radially inward from a peripheral end of the vertical portion 310 (i.e., at or near the end that is furthest away from the annular member 300). In some embodiments, heater elements 204 may be disposed only in one or more of the horizontal portions 312 of the spokes 308 to heat the lid 120. Power from power supply 123 may be provided to shielded lid heater 190 via an electrical connector 322 coupled to leads 324 disposed on the annular member 300. The leads 324 connect to an electrical connector disposed within the annular member 300 and the spokes 308 to provide power to heater elements 204. In some embodiments, the heater elements in each spoke may be individually controlled.

In some embodiments, the horizontal portion 312 of the spokes 308 may be different lengths depending on the amount of surface area coverage desire. For example, in some embodiments as shown in FIGS. 3A and 3C, horizontal portion 312 of spokes 308B are generally shorter than the horizontal portion 312 of spokes 308A and are interweaved between adjacent spokes 308A to form a spoke-like pattern. In other embodiments, the spokes 308 may be all the same length or have more than just two different lengths. The width of spokes 308 may also be adjusted based on the amount of shield coverage of the lid is sought. The shielded lid heater 190 shown in FIGS. 3A-3C is disposed on lid 120 such that spokes 308 are coupled to, and configured to heat, lid 120.

Figure 4A:
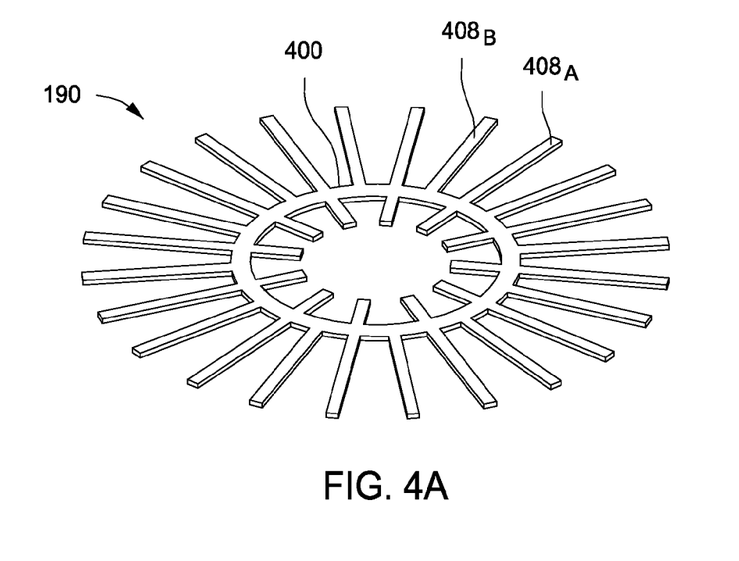
FIGS. 4A-4B are an isometric view and bottom view, respectively, of at least one other embodiment of the shielded lid heater of FIG. 2.
Figure 4B:
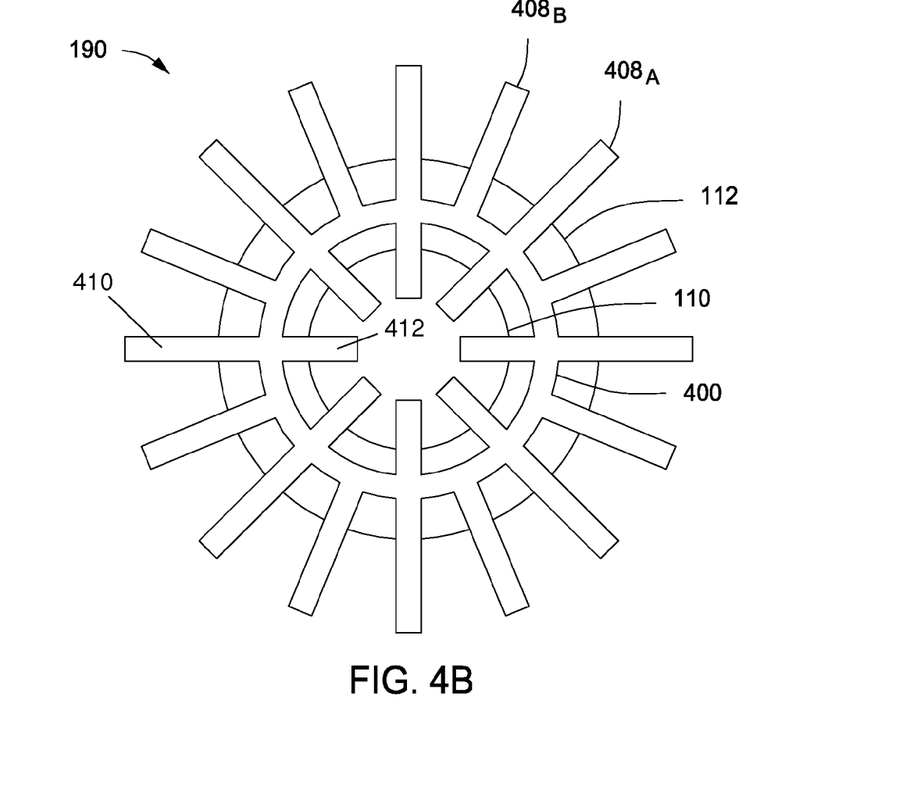

FIGS. 4A and 4B depict an isometric view and bottom view, respectively, of at least one other embodiment of inventive shielded lid heater 190. The shielded lid heater 190 in this embodiment generally includes an annular member 400 and a plurality of spokes 408. Unlike the annular member 300 shown in FIGS. 3A-3C which was disposed on a peripheral edge of the shielded lid heater 190 and positioned higher than the horizontal portion 312 of spokes 308, the annular member 400 is disposed in an inner portion of the shielded lid heater 190 such that the annular member 400 is positioned beneath and between the first inner coil 110 and the second outer coil 112 which disposed on the lid 120 as shown in FIG. 4B.

Specifically, the inventors have observed that when ICP reactor is run in an out-of-phase mode, the magnetic field between the first inner coil 110 and the second outer coil 112 is substantially canceled out. Thus, by positioning the annular member 400 between the first inner coil 110 and the second outer coil 112 where the magnetic field has been minimized, the current induced in the annular member 400 is also minimized, as are the associated RF power losses.

In an in-phase mode, the inventive shielded lid heater 190 may be advantageously used to control the plasma profile produced in the reactor 100. Specifically, in an in-phase mode, the magnetic field between the first inner coil 110 and the second outer coil 112 is additive and large enough to adversely affect the etch pattern and cause non-uniformities at the substrate level due to the M-shape signature. By positioning the annular member 400 between the first inner coil 110 and the second outer coil 112 where the magnetic field has been maximized, a current is induced in annular member 400 that runs in the opposite direction of the current running through the first inner coil 110 and the second outer coil 112. Thus, the annular member 400 essentially acts as a third coil with current running in the opposite direction reducing/minimizing the additive effects of the combined magnetic field produced by the first inner coil 110 and the second outer coil 112, and reducing the M-shape etch pattern or other processing non-uniformities at the substrate level.

The annular member 400 and spokes 408 are disposed in the same plane. The bottom surfaces of both the annular member 400 and the spokes 408 are coupled to the top surface of the lid 120. Each spoke includes an outer portion 410 that is coupled to the annular member 400 and extends radially outward from the annular member 400. In addition, in some embodiments, at least some of the spokes 408 may include an inner portion 412 that extends radially inward from the annular member 400. In some embodiments, heater elements 204 are disposed in one or more spokes 408 and/or annular member 400 to heat lid 120. Power from power supply 123 may be provided to shielded lid heater 190 via an electrical connector coupled to the annular member 400, or to one or more of spokes 408.

In some embodiments, the inner diameter of the annular member 400 may be about 2 inches to about 10 inches, and the outer diameter may be about 5 inches to about 25 inches, although other diameters may be used.

In some embodiments, the spokes 408 may be different lengths depending on the amount of surface area coverage sought. For example, in some embodiments as shown in FIGS. 4A and 4B, spokes 408B are generally shorter than spokes 408A and are interweaved between adjacent spokes 408A to form a spoke-like pattern. In other embodiments, the spokes 408 may be all the same length or have more than just two different lengths. The width of spokes 408 may also be adjusted based on how much shield coverage of the lid is sought. The shielded lid heater 190 shown in FIGS. 4A-4B is disposed on lid 120 such that spokes 408 are coupled to, and configured to heat, lid 120.

In some embodiments, the shielded lid heater 190 may be formed in sections (such as halves, or quarters), with each section being coupled to each other to form the annular members 300 and 400. In some embodiments, the internal configuration of the annular members 300, 400 and each spoke 308, 408 may be as described above with respect to FIG. 2. That is, annular members 300 and 400 and each spoke 308, 408 may include one or more of a conductive base 202, a heater element 204 and an RF shield 206.

Referring back to FIG. 1, a the reactor 100 may include one or more other components to manage temperature and/or control plasma distribution in the reactor 100, as illustrated in FIGS. 1 through 3B. For example, the one or more components may include a first conductive body 160 disposed about the substrate support 116 in the inner volume 105 of the process chamber 104. The first conductive body 160 is electrically conductive and may be a cathode sleeve (e.g., a sleeve that surrounds the substrate support 116), for example, to influence plasma behavior in the inner volume 105 and/or proximate the substrate support 116. The first conductive body 160 may have any suitable shape to provide specific plasma behavior, for example, such as a cylinder, or the like. The first conductive body 160 may include a first end 162 and a second end 164.

In some embodiments, the reactor 100 may comprise a liner 101 disposed within the process chamber 104 to manage temperature and/or control plasma distribution in the reactor 100. The liner 101 may generally comprise a second conductive body 174 having a first channel 180 formed in a first end 111 of the second conductive body 174 and a conductive ring 166 coupled to a second end 113 of the second conductive body 174. In some embodiments, the conductive ring 166 may have an inner edge 168 coupled to the first end 162 of the first conductive body 160. Alternatively, in some embodiments, the inner edge 168 may be disposed immediately adjacent to or rest on or against the conductive body 160 at or near the first end 162. The inner edge 168 of the conductive ring 166 may be positioned with respect to the first conductive body 160 such that no gap exists between the conductive ring 166 and the first conductive body 160. An outer edge 170 of the conductive ring 166 may be disposed radially outward from the inner edge 168 of the conductive ring 166. The conductive ring 166 may be a plasma screen or the like, and may influence behavior of a plasma in the inner volume 105 of the process chamber 104 and/or proximate the substrate support 116. For example, the conductive ring 166 may include a plurality of openings 172 disposed through the conductive ring 166 to fluidly couple a first region 107 of the inner volume 105 to a second region 109 of the inner volume 105. For example, as illustrated in FIG. 1, the first region 107 may be above the substrate support 116 and the second region 109 may be adjacent to and/or below the substrate support 116. In some embodiments, the first region 107 may be a processing volume above the substrate support 116 and the second region 109 may be an exhaust volume adjacent to and/or below the substrate support 116.

The second conductive body 174 is coupled to the outer edge 170 of the conductive ring 166. At least a portion 176 of the second conductive body 174 may be disposed above the conductive ring 166 (e.g., may extend from the conductive ring 166 towards the lid 120, as illustrated in FIG. 1. The conductive ring 166 and the at least a portion 176 of the second conductive body 174 may partially bound or define the first region 107 above the conductive ring 166. For example, the conductive ring 166, the at least a portion 176 of the second conductive body 174, and the lid 120 may together define the first region 107, as illustrated in FIG. 1. The second conductive body 174 may be a chamber liner. For example, the second conductive body 174 may be configured to line at least portions of the chamber wall 130 and may include one or more openings (not shown) such as openings to facilitate inlet of process gases in the inner volume 105 and/or inlet of the substrate 115 into the inner volume 105.

The second conductive body 174 may be utilized transfer heat from a heater 178 to inner volume facing surfaces of the second conductive body 174 as well as inner volume facing surfaces of the conductive ring 166 and the first conductive body 160. For example, the heater 178 may be configured to heat the first conductive body 160, the second conductive body 174, and the conductive ring 166. The heater 178 may be any suitable heater, such as a resistive heater or the like, and may comprise a single heating element or a plurality of heating elements. In some embodiments, the heater 178 may provide a temperature of about 100 to about 200 degrees Celsius, or about 150 degrees Celsius. The inventors have discovered that providing such temperatures facilitates a reduction of the memory effect associated with fluorine processing.

The second conductive body 174 may include a first channel 180 disposed in the second conductive body 174 and isolated from the first region 107. For example, as illustrated in FIG. 1, the first channel may be disposed in an end of the at least a portion 176 of the second conductive body 174 proximate the lid 120 and may extend into the second conductive body 174. As illustrated in FIG. 1, the heater 178 may be disposed in the first channel 180. For example, the heater 178 may be a resistive heater and, in some embodiments, may be encased in a sheath, such as ICONEL®, stainless steel, or the like. In some embodiments, the heater may be located about midway in the upper liner. Locating the heater 178 not too far and not too close to the coolant channel facilitates balancing heat loss and temperature uniformity.

A third conductive body 182 may be disposed adjacent to the second end 164 of the first conductive body 160 opposite the first end 162. In some embodiments, the third conductive body 182 may be coupled to the second end 164 of the first conductive body 160 opposite the first end 162. The third conductive body 182, the conductive ring 166, and the first conductive body 160 may bound, or partially define, the second region 109 disposed below the first region 107 of the inner volume 105. The inventors have discovered that controlling temperature of inner volume facing surfaces of the one or more components 160, 166, 174, and/or 182 can be utilized to reduce defect and/or particle formation on the substrate 115. For example, the inventors have discovered that if the temperature of the inner volume facing surfaces of the one or more components is not controlled, then various species, such as process gases, plasma species and/or byproducts formed from interaction with the substrate 115 may form on the inner volume facing surfaces. During processing the various species may flake off the inner volume facing surfaces and contaminate the substrate 115. In some embodiments, such as when fluorine (F) containing gases are used, the process chamber 104 may use a separate plasma cleaning to remove fluorine-containing species formed on the inner volume facing surfaces. However, improved control of temperature of the inner volume facing surfaces of the one or more components 160, 166, 174, and/or 182 during processing time and/or idle time between substrates may reduce the need for such cleanings and may extend the mean time between cleanings for the reactor 100. Further, temperature variation along the inner volume facing surfaces of the one or more components 160, 166, 174 and/or 182 may result in non-uniformities in a plasma formed in the process chamber 104. As such, embodiments of the present disclosure may facilitate more uniform temperature along the inner volume facing surfaces of the one or more components 160, 166, 174 and/or 182 that may result in a more uniform plasma formed in the process chamber 104 as compared to conventional processing chambers. In addition, the present disclosure provides a more uniform RF ground path within the chamber that facilitates plasma uniformity.

In some embodiments, the third conductive body 182 may facilitate control over temperature on the inner volume facing surfaces of the one or more components 160, 166, 174, and/or 182. For example, the inventors have discovered that when the second end 164 of the first conductive body 160 is directly coupled to the chamber wall 130, for example, at the base of the process chamber 104, that temperature of the inner volume facing surfaces may be difficult to control due to rapid heat loss to the chamber wall 130. For example, the chamber wall 130 may act as a heat sink which may result in temperature variation on the inner volume facing surfaces of the one or more components 160, 166, and/or 174. Accordingly, the inventors have provided the third conductive body 182 to improve temperature control on the inner volume facing surfaces. For example, the third conductive body 182 may prevent the first conductive body 160 from directly contacting the wall 130 of the process chamber. Accordingly, the third conductive body 182 may prevent heat loss due to transfer to the chamber wall 130, and instead may facilitate more uniform temperature distribution about the inner volume facing surfaces of the one or more components 160, 166, 174, and/or 182. The conductive bodies and conductive rings described herein may be fabricated from any suitable process compatible materials, such as aluminum (e.g., T6 6061) or the like. In some embodiments, the materials may be treated and/or coated, such as by anodization or having a coating of yttrium deposited thereon.

Further, the first conductive body 160 may remain electrically coupled to the chamber wall 130 of the process chamber 104 via the third conductive body 182. However, through the presence of the third conductive body 182, the first conductive body 160 may be thermally decoupled from the wall 130 of the process chamber 104.

Temperature control may further be provided by a fourth body 184 disposed externally to and about the second conductive body 174. For example, as illustrated in FIG. 1, the fourth body 184 may be disposed above the chamber wall 130 and below at least a portion of the second conductive body 174 proximate the lid 120. In some embodiments, the fourth body 184 may be a ring or a spacer disposed between a flange of the second conductive body 174 and the chamber wall 130. For example, as illustrated the fourth body 184 may be disposed about the second conductive body 174 proximate the location of the first channel 180 and the heater 178. Alternatively, the fourth body 184 may be located at any suitable location about the second conductive body 174 to improve temperature control of the one or more components 160, 166, 174 and/or 182.

The fourth body 184 may include a second channel 186 to flow a coolant through the second channel 186. For example, the coolant may act in combination with the heater 178 to provide the desired temperature to the inner surfaces of the one or more components 160, 166, 174, and/or 182. The coolant may include any suitable coolant such as one or more of ethylene glycol, water, or the like. The coolant may be provided to the second channel 186 by a coolant source 188. The coolant may be provided at a temperature of about 65 degrees Celsius, or other suitable temperature depending upon the process being performed. For example, the heater 178 and the coolant may act in combination to provide temperatures of about 100 to about 200, or about 150 degrees Celsius to the inner surfaces of the one or more components 160, 166, 174 and/or 182.

The one or more components 160, 166, 174 and/or 182 may include additional features to improve temperature control, plasma uniformity, and/or process yield in the process chamber 104. For example, the openings of the second conductive body 174, such as to facilitate inlet of a process gas and/or a substrate may be anodized. For example, the composition of the first conductive body 160, the second conductive body 174, the third conductive body 182 and/or the conductive ring 166 may be selected to improve heat transfer. For example, in some embodiments, the first conductive body 160, the second conductive body 174, the third conductive body 182 and/or the conductive ring 166 may comprise aluminum (Al), and in some embodiments, anodized aluminum, or the like. For example, one or more of the components 160, 166, 174, and/or 182 may be fabricated in a single piece to improve heat transfer. For example, in some embodiments, the second conductive body 174 and the conductive ring 166 may be fabricated in a single piece. Alternatively, one or more of the components 160, 166, 174, and/or 182 may be fabricated from separate pieces and coupled together using a suitable fastener to provide a robust connection with good thermal contact, such as one or more of bolts, clamps, springs, or the like. In some embodiments, a coating may be formed on the inner volume facing surfaces of the one or more components 160, 166, 174, and/or 182 to limit corrosion and/or sticking that may otherwise facilitate particulate deposition on and/or defects formed in the substrate 115. For example, in some embodiments, a non-conductive coating may be formed on surfaces (e.g., inner volume facing surfaces) of the second conductive body 174 and the conductive ring 166. In some embodiments, the non-conductive coating may comprise one or more of yttrium oxide ($Y_2O_3$), or the like.

Returning to FIG. 1, in some embodiments, the lid 120 may be substantially flat. Other modifications of the process chamber 104 may have other types of lids such as, for example, a dome-shaped lid or other shapes. The inductively coupled plasma apparatus 102 is typically disposed above the lid 120 and is configured to inductively couple RF power into the process chamber 104. The inductively coupled plasma apparatus 102 includes the first and second coils 110, 112, disposed above the lid 120. The relative position, ratio of diameters of each coil, and/or the number of turns in each coil can each be adjusted to control, for example, the profile or density of the plasma being formed via controlling the inductance on each coil. Each of the first and second coils 110, 112 is coupled through a matching network 114 via the RF feed structure 106, to the RF power supply 108. The RF power supply 108 may illustratively be capable of producing up to about 4000 W (but not limited to about 4000 W) at a tunable frequency in a range from 50 kHz to 13.56 MHz, although other frequencies and powers may be provided for particular applications.

In some embodiments, a power divider 117, such as a dividing capacitor, may be provided between the RF feed structure 106 and the RF power supply 108 to control the relative quantity of RF power provided to the respective first and second coils. For example, as shown in FIG. 1, the power divider 117 may be disposed in the line coupling the RF feed structure 106 to the RF power supply 108 for controlling the amount of RF power provided to each coil (facilitating control of plasma characteristics in zones corresponding to the first and second coils). In some embodiments, the power divider 117 may be incorporated into the match network 114. In some embodiments, after the power divider 117, RF current flows to the RF feed structure 106 where it is distributed to the first and second coils 110, 112. Alternatively, the split RF current may be fed directly to each of the respective first and second RF coils.

During operation, the substrate 115 (such as a semiconductor wafer or other substrate suitable for plasma processing) may be placed on the substrate support 116 and process gases may be supplied from a gas panel 138 through entry ports 126 to form a gaseous mixture 150 within the process chamber 104. For example, prior to introduction of the process gases, the one or more components 160, 166, 174, and/or 182 may be controlled, for example, by the heater 178 and the coolant as discussed above to have inner volume facing surfaces at a temperature of between about 100 to 200 degrees Celsius, or about 150 degrees Celsius. The gaseous mixture 150 may be ignited into a plasma 155 in the process chamber 104 by applying power from the RF power supply 108 to the first and second coils 110, 112. In some embodiments, power from the bias source 122 may be also provided to the substrate support 116. The pressure within the interior of the process chamber 104 may be controlled using a throttle valve 127 and a vacuum pump 136. The temperature of the chamber wall 130 may be controlled using liquid-containing conduits (not shown) that run through the wall 130.

The temperature of the substrate 115 may be controlled by stabilizing a temperature of the substrate support 116. In some embodiments, helium gas from a gas source 148 may be provided via a gas conduit 149 to channels defined between the backside of the substrate 115 and grooves (not shown) disposed in the substrate support surface. The helium gas is used to facilitate heat transfer between the substrate support 116 and the substrate 115. During processing, the substrate support 116 may be heated by a resistive heater (not shown) within the substrate support to a steady state temperature and the helium gas may facilitate uniform heating of the substrate 115. Using such thermal control, the substrate 115 may illustratively be maintained at a temperature of between 0 and 500 degrees Celsius.

The controller 140 comprises a central processing unit (CPU) 144, a memory 142, and support circuits 146 for the CPU 144 and facilitates control of the components of the reactor 100 and, as such, of methods of forming a plasma, such as discussed herein. The controller 140 may be one of any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The memory 142 stores software (source code) that may be executed or invoked to control the operation of the reactor 100 in the manner described herein. The software routine may also be stored and/or executed by a second CPU (not shown) that is remotely located from the hardware being controlled by the CPU 144.

Thus, apparatus for plasma processing are provided herein. The inventive substrate processing apparatus advantageously reduces RF losses associated with shielded lid heaters. In addition, in some embodiments, the inventive substrate processing apparatus advantageously reduces additive electric field properties between adjacent plasma coils in multi-coil plasma apparatus. Accordingly, a plasma formed utilizing the inventive plasma apparatus has an improved electric field distribution, and can be utilized to produce a smoother etch surface.

While the foregoing is directed to embodiments of the present disclosure, other and further embodiments of the disclosure may be devised without departing from the basic scope thereof.

The invention claimed is:

1. A plasma processing apparatus, comprising:
   a process chamber having a dielectric lid and an interior processing volume beneath the dielectric lid;
   a first radio-frequency (RF) coil disposed above the dielectric lid to couple RF energy into the interior processing volume; and
   a RF shielded lid heater coupled to a top surface of the dielectric lid comprising:
   an annular member, and
   a plurality of spokes, wherein each of the plurality of spokes includes one of (a) a first portion that extends downward from the annular member and couples the annular member to a second portion of the spoke that extends radially inward, or (b) a first portion that extends radially outward from the annular member.

2. The plasma processing apparatus of claim 1, wherein each of the plurality of spokes includes a first portion that extends downward from the annular member and couples the annular member to a second portion of the spoke that extends radially inward, and wherein a first RF coil is disposed within a central opening formed by the annular member and the plurality of spokes.

3. The plasma processing apparatus of claim 2, wherein one or more heater elements are disposed in the second portion of each spoke that extends radially inward.

4. The plasma processing apparatus of claim 2, wherein the second portion of each spoke is coupled to the top surface of the dielectric lid.

5. The plasma processing apparatus of claim 1, wherein each of the plurality of spokes includes a first portion that extends radially outward from the annular member, and wherein the annular member disposed proximate an inner portion of the RF shielded lid heater.

6. The plasma processing apparatus of claim 5, further comprising:
a second RF coil disposed above the dielectric lid to couple RF energy into the interior processing volume, the second RF coil disposed coaxially with respect to the first RF coil.

7. The plasma processing apparatus of claim 6, wherein the annular member is position beneath and between the first RF coil and the second RF coil.

8. The plasma processing apparatus of claim 1, wherein n a first RF coil is disposed within a central opening formed by the annular member and the plurality of spokes.

9. A radio-frequency (RF) shielded lid heater, comprising:
an annular member;
a plurality of spokes coupled to the annular member, wherein each of the plurality of spokes includes a first portion that extends downward from the annular member and couples the annular member to a second portion of the spoke that extends radially inward, and wherein the annular member and the plurality of spokes are RF shields; and
one or more heater elements disposed within or below one or more of the plurality of spokes.

10. The RF shielded lid heater of claim 9, wherein the annular member and the plurality of spokes comprise at least one of an aluminum foil, an aluminum plate, or an aluminum coating.

11. The RF shielded lid heater of claim 9, wherein the one or more heater elements are disposed in the second portion of each spoke that extends radially inward.

12. The RF shielded lid heater of claim 9, wherein the annular member is continuous and does not contain any breaks.

13. The RF shielded lid heater of claim 9, wherein the plurality of spokes are interleaved spokes of different lengths.

14. The RF shielded lid heater of claim 9, wherein each spoke further includes a conductive base and an RF shield, wherein the one or more heater elements are disposed between the conductive base and the RF shield.

15. A radio-frequency (RF) shielded lid heater, comprising:
an annular member disposed proximate an inner portion of the shielded lid heater;
a plurality of spokes coupled to the annular member, wherein each of the plurality of spokes includes a first portion that extends radially outward from the annular member, wherein the annular member and the plurality of spokes are RF shields; and
one or more heater elements disposed within or below at least one of the annular member or one or more of the plurality of spokes.

16. The RF shielded lid heater of claim 15, wherein the annular member and the plurality of spokes comprise at least one of an aluminum foil, an aluminum plate, or an aluminum coating.

17. The RF shielded lid heater of claim 15, wherein at least some of the plurality of spokes extend radially inward from the annular member.

18. The RF shielded lid heater of claim 15, wherein the annular member is continuous and does not contain any breaks.

19. The RF shielded lid heater of claim 15, wherein the plurality of spokes are interleaved spokes of different lengths.

20. The RF shielded lid heater of claim 15, wherein the annular member and each spoke further include a conductive base and an RF shield, wherein the one or more heater elements are disposed between the conductive base and the RF shield.

21. The RF shielded lid heater of claim 15, wherein an inner diameter of the annular member is about 2 inches to about 10 inches, and an outer diameter of the annular member is about 5 inches to about 25 inches.

* * * * *